United States Patent
Javora et al.

(10) Patent No.: US 9,297,829 B2
(45) Date of Patent: Mar. 29, 2016

(54) MULTIFUNCTIONAL MEASURING DEVICE

(71) Applicant: ABB Technology AG, Zürich (CH)

(72) Inventors: Radek Javora, Brno (CZ); Jaromir Podzemny, Brno (CZ); Marek Pavlas, Otnice (CZ)

(73) Assignee: ABB TECHNOLOGY AG, Zurich (CH)

( * ) Notice: Subject to any disclaimer, the term of this patent is extended or adjusted under 35 U.S.C. 154(b) by 367 days.

(21) Appl. No.: 13/855,290

(22) Filed: Apr. 2, 2013

(65) Prior Publication Data
US 2013/0214765 A1 Aug. 22, 2013

Related U.S. Application Data

(63) Continuation of application No. PCT/CZ2010/000103, filed on Oct. 4, 2010.

(51) Int. Cl.
| | |
|---|---|
| *G01R 1/00* | (2006.01) |
| *G01R 1/02* | (2006.01) |
| *G01R 15/18* | (2006.01) |
| *H01F 38/30* | (2006.01) |
| *H01F 5/02* | (2006.01) |
| *H01F 27/28* | (2006.01) |
| *H01F 1/00* | (2006.01) |
| *H01L 21/00* | (2006.01) |

(52) U.S. Cl.
CPC ............... *G01R 1/02* (2013.01); *G01R 15/181* (2013.01); *H01F 5/02* (2013.01); *H01F 27/2823* (2013.01); *H01F 38/30* (2013.01); *H01F 1/00* (2013.01); *H01L 21/00* (2013.01); *H01L 2221/00* (2013.01)

(58) Field of Classification Search
CPC ............. G01R 1/00; H01F 1/00; H01L 21/00; H01L 2221/00
See application file for complete search history.

(56) References Cited

U.S. PATENT DOCUMENTS

| | | | |
|---|---|---|---|
| 3,603,146 A * | 9/1971 | Bennett et al. | 73/861.16 |
| 4,847,583 A * | 7/1989 | Bernard | 336/84 C |
| 6,624,624 B1 * | 9/2003 | Karrer | G01R 15/181 324/117 R |
| 8,912,807 B2 * | 12/2014 | Chamarti et al. | 324/654 |
| 2007/0114992 A1 | 5/2007 | Muniraju et al. | |

(Continued)

FOREIGN PATENT DOCUMENTS

| | | |
|---|---|---|
| WO | WO 2009/001185 A1 | 12/2008 |
| WO | WO 2009/139521 A1 | 11/2009 |

OTHER PUBLICATIONS

International Search Report (PCT/ISA/210) issued on Jul. 4, 2011, by the European Patent Office as the International Searching Authority for International Application No. PCT/CZ2010/000103.

(Continued)

*Primary Examiner* — Huy Q Phan
*Assistant Examiner* — Temilade Rhodes-Vivour
(74) *Attorney, Agent, or Firm* — Buchanan Ingersoll & Rooney PC

(57) ABSTRACT

A multifunctional measuring device, such as for measuring a current in a primary current conductor in a medium voltage switchgear is disclosed which includes a housing with an aperture for accommodation of the primary current conductor; an inner winding accommodated around the aperture inside of the housing for a measurement of current in a primary current conductor; and an external winding wound on the housing around the aperture for another current measurement.

17 Claims, 4 Drawing Sheets

(56) References Cited

U.S. PATENT DOCUMENTS

| | | | | |
|---|---|---|---|---|
| 2008/0007249 | A1* | 1/2008 | Wilkerson et al. | 324/127 |
| 2008/0079418 | A1 | 4/2008 | Rea et al. | |
| 2009/0243776 | A1* | 10/2009 | Park | H01F 30/04 336/184 |
| 2012/0008245 | A1* | 1/2012 | Moffitt | H02H 3/085 361/103 |
| 2012/0126789 | A1 | 5/2012 | Turpin | |

OTHER PUBLICATIONS

Written Opinion (PCT/ISA/237) issued on Jul. 4, 2011, by the European Patent Office as the International Searching Authority for International Application No. PCT/CZ2010/000103.

* cited by examiner

MULTIFUNCTIONAL MEASURING DEVICE

RELATED APPLICATION

This application claims priority as a continuation application under 35 U.S.C. §120 to PCT/CZ2010/000103 filed as an International Application on Oct. 4, 2010 designating the U.S., the entire content of which is hereby incorporated by reference in its entirety.

FIELD

A multifunctional measuring device containing two current measuring devices in one apparatus is disclosed, whereby a single device accommodated in space available can provide measurements using measuring elements with different parameters, ratings or accuracy design.

BACKGROUND

A medium voltage switchgear can involve control units, protections, evaluating and calibration devices. The number of these apparatuses is growing in conjunction with a development of power supplies that brings along a desire for introducing a considerable amount of current or voltage measuring or sensing devices that could be different for every application. It is not possible to place every suitable measuring device in a space available in switchgears or in other applications, not to mention the acquisition costs.

WO 2009/001185 discloses a Rogowski-loop current sensor having a winding extending between two ends and embracing a primary conductor, the current of which is measured. The sensor further includes a closing mechanism provided at the ends of the winding, which ends can be moved away from or towards each other. The closing mechanism includes a body having a high magnetic permeability and extending between the ends when the loop is closed. This solution does not provide measurements using measuring elements with different parameters, ratings or accuracy design inside a switchgear due to the fact that the measuring element consists of just one winding.

WO 2009/139521 discloses a clamp type current sensor with a Rogowski coil, wound on a flexible air-core. The Rogowski coil is accommodated in a circular housing consisting of two semicircular housing members. The housing can be closed by shielding covers engaged with upper open ends of the semicircular housing members. This solution does not provide measurements using measuring elements with different parameters, ratings or accuracy design inside a switchgear due to the fact that the measuring element consists of just one winding.

Current measurements in medium voltage switchgears often can involve different measuring elements for different purposes. Known solutions use two measuring devices when a desire arises to measure, for example, relatively small fluctuations of the current with high accuracy for revenue metering purposes and at the same time to measure high dynamic range or sudden big changes of the current value (e.g., short circuit), for protection and control purposes. The only possibility to conduct both measurements is to change the measuring element. A small space in new medium voltage switchgears may not enable using two separate measuring devices at the same time.

It would be desirable to provide a small and compact measuring device with at least two measuring inputs having different ratings or accuracy of coils used as measuring elements.

SUMMARY

A multifunctional measuring device is disclosed which comprises: a housing with an aperture for receiving a primary current conductor therethrough; an inner winding, accommodated around said aperture inside of said housing for measuring a current in a primary current conductor; and an external winding wound on said housing around said aperture for providing an additional current measurement.

BRIEF DESCRIPTION OF THE DRAWINGS

Exemplary embodiments will be further described in detail according to the enclosed drawings, wherein.

DETAILED DESCRIPTION

A multifunctional measuring device is disclosed comprising a housing with an aperture for accommodation of a primary current conductor; an inner winding, accommodated around the aperture inside of the housing for a measurement of the current in the primary current conductor; and an external winding wound on the housing around the aperture for another current measurement.

In an exemplary embodiment of the multifunctional measuring device, the housing has a toroidal shape. The inner winding can be wound on a toroidal shape bobbin or can comprise a plurality of series connected coils wound on bobbins arranged in a shape of a polygon around the aperture. In the latter case the axes on the bobbins are arranged in a plane transverse, for example, substantially perpendicular, to the axis of said primary current conductor accommodated in the aperture and at the same time tangentially around the axis of said primary current conductor passing through the aperture.

The housing comprises, for example, a lower part and an upper part, and the inner winding is contained between the lower part and the upper part of said housing.

The housing is, for example, made of insulating material or of plastic or it can be made of semiconductive or conductive material, or other suitable material. In the latter case, both the lower part and the upper part of the housing are, for example, earthed for screening of the inner winding. The inner winding can be mechanically fixed inside of the housing by a material filling a space between the inner winding and an inside surface of the housing.

In other exemplary embodiments, the inner winding is wound around a plastic, semi-conductive or conductive but non-ferromagnetic core material.

The external winding and/or the internal winding is for example, based on a non-magnetic core coil design.

To provide a mechanical protection of the multifunctional measuring device, the housing with the external winding and/or internal winding can be inserted into at least one another bigger casing.

To provide an electrical shielding of the multifunctional measuring device, the housing with the external winding and/or the internal winding can be inserted into an electrically semi-conductive or conductive cover.

Figure 1:
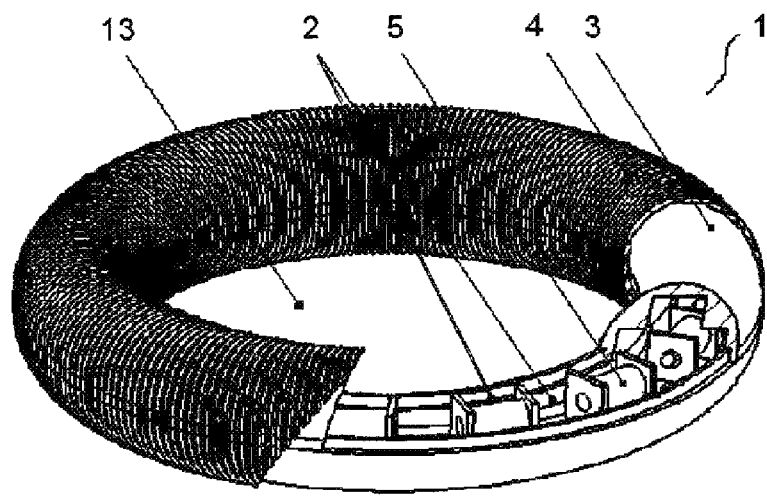
FIG. 1 shows an exemplary multifunctional measuring device designed with a partly uncovered housing displaying thus a set of coils inside the housing.

FIG. 1 shows an exemplary multifunctional measuring device 1 having a housing 3 with an aperture 13 for passing of a primary current conductor through. A part of the housing is removed to show the inside of the housing 3. Inside of said housing 3 and around said aperture 13 is accommodated an inner winding 2 for a measurement of a current in the primary current conductor. An external winding 4 is wound on said housing 3 around the aperture 13 for another current measurement. The embodiment shown on FIG. 1 has a toroidal shape. An inner winding 2 comprises a plurality of series connected coils 5 wound on bobbins arranged in a shape of a polygon around the aperture 13.

Figure 2:
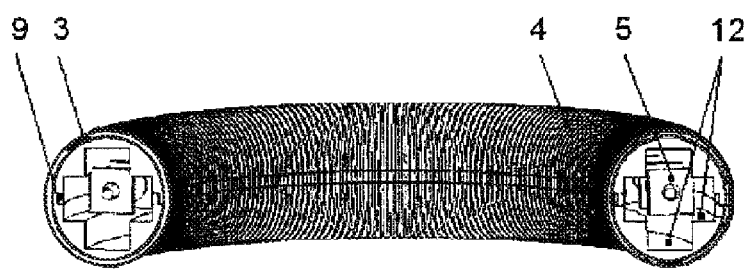
FIG. 2 shows a section of the multifunctional measuring device of FIG. 1.

FIG. 2 shows a section of the multifunctional measuring device 1. The housing 3 in this embodiment comprises two parts, as clearly shown on FIGS. 3 and 4, and includes also a positioning/locking mechanism 9 for securing exact placement of the parts and their proper fitting to each other.

Figure 3:
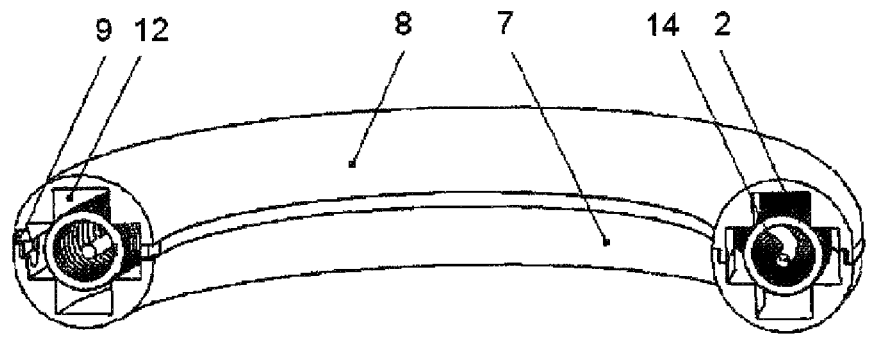
FIG. 3 shows a section of an exemplary multifunctional measuring device with a toroidal coil inside the housing.

FIG. 3 shows a section of the multifunctional measuring device 1. As in the previous picture, the inner winding 2 is secured inside of the housing 3 with shims 12 that enable a better and easier positioning of the inner winding 2 and prevent a movement and misplacement of the individual coils 5 inside of the housing 3. A lower part 7 and an upper part 8 of the housing 3 are secured to each other with the positioning/ locking mechanism 9. A return conductor 14 could be used for eliminating or at least reducing effects of stray magnetic fields.

Figure 4:
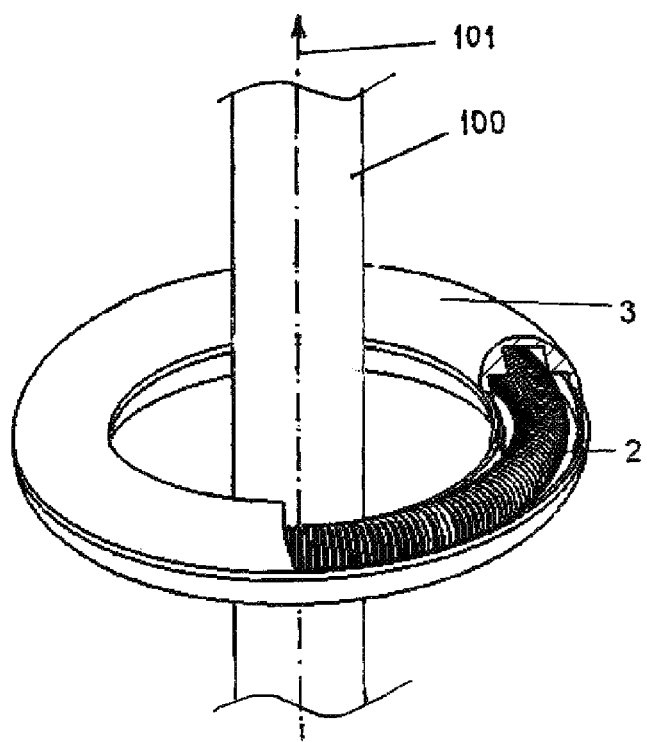
FIG. 4 shows an exemplary multifunctional measuring device designed with a partly uncovered housing displaying a toroidal coil inside the housing.

FIG. 4 shows a section of the multifunctional measuring device 1 in a form of a Rogowski coil. The primary conductor 100 passes through the aperture 13 and its axis 101 is in this embodiment substantially perpendicular to the plane of the aperture 13.

Figure 5:
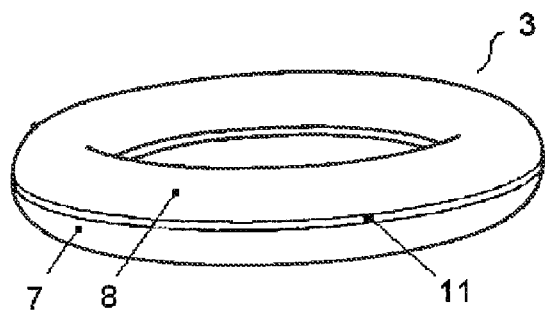
FIG. 5 shows an exemplary multifunctional measuring device in an assembled state and designed in a single toroid winding version.

FIG. 5 shows the multifunctional measuring device 1 in an assembled state. In this case the output wires of the inner winding 2 and/or return conductor 14 can come out for connection to external devices evaluating the measured signal. This is achieved through an opening 11 in the housing 3. In such case the external winding 4 is adapted to provide a small gap to enable access of the output wires of the inner winding 2 and/or return conductor 14 to the opening 11. For example, such gap is as small as possible and the external winding 4 is wound uniformly along the whole circumference of the housing 3. Both the lower part 7 and the upper part 8 of the housing 3 are locked together by the positioning/locking mechanism 9.

Figure 6:
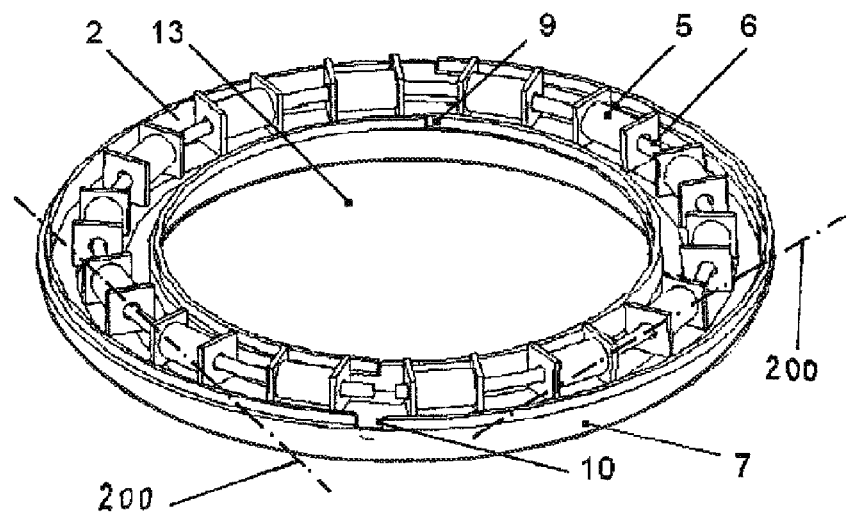
FIG. 6 shows an exemplary multifunctional measuring device without an upper part of the housing and with the set of coils inside the housing.

FIG. 6 shows the multifunctional measuring device 1 with a removed upper part 8 of the housing 3, so that the inside of the housing 3 is visible. The inner winding 2 is accommodated in the lower part 7 of the housing 3 and comprises a plurality of series connected coils 5 wound on bobbins arranged in a shape of, for example, a polygon around the aperture 13. The coils 5 are connected by a conductor 6 and may touch each other or, as can be seen on this picture, they may have a small space between themselves. The axes 200 of said bobbins are arranged in a plane substantially perpendicular to the axis 101 of the primary current conductor 100 accommodated in the aperture 13 and tangentially around the axis 101 of said primary current conductor 100. The inner winding 2 is wound on a plastic, semi-conductive or conductive but non-ferromagnetic core material. The lower part 7 of the housing 3 is provided with said positioning/locking mechanism 9 and both the lower part 7 and the upper part 8 are provided with corresponding slits 10. The two slits 10 located on the external positioning/locking mechanism 9 of the lower part 7 and the upper part 8 in the locked position of the housing 3 overlap and provide an opening 11 in the housing 3 that enables output wires of the inner winding 2 to come out of the housing 3 in order to connect the inner winding 2 to some external devices evaluating and processing the measured signal. In case of wireless communication, the opening 11 may not be needed.

Figure 7:
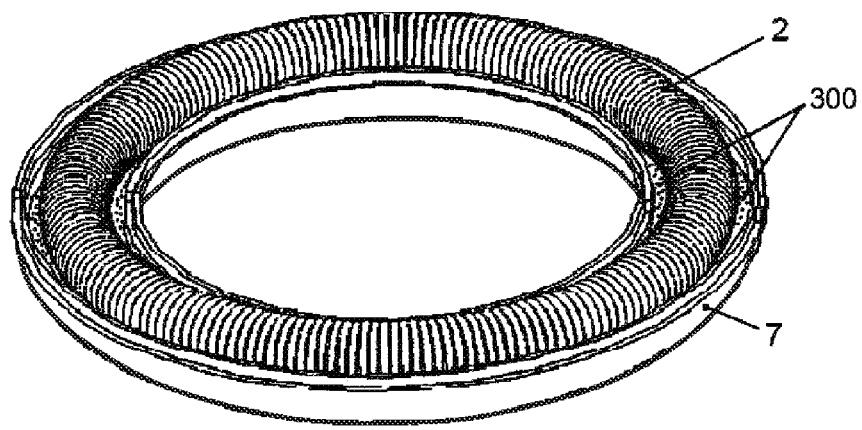
FIG. 7 shows an exemplary multifunctional measuring device without the upper part of the housing and with the toroidal coil inside the housing.

FIG. 7 shows the multifunctional measuring device 1 with a removed upper part 8 of the housing 3, so that the inside of the housing 3 is visible. The inner winding 2 is accommodated in the lower part 7 of the housing 3 and is wound on a toroidal shape core in a form of a toroidal winding and is mechanically fixed inside of the housing 3 between the lower part 7 and the upper part 8 by a material 300 filling a space between the inner winding 2 and an inside surface of the housing 3. The filling material 300, schematically indicated only in FIG. 7, can be for example glue, epoxy resin, or any suitable material.

Figure 8:
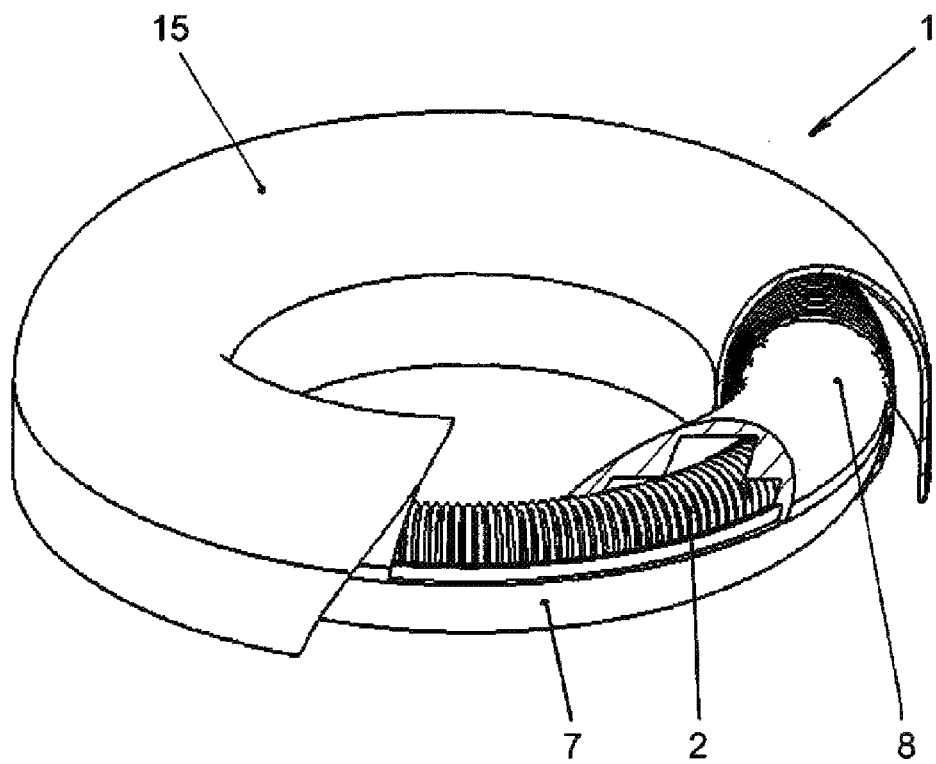
FIG. 8 shows an exemplary multifunctional measuring device designed with a partly uncovered housing displaying a bigger case encasing the housing with the toroidal coil inside the housing.

FIG. 8 shows a section of the multifunctional measuring device 1 in a form of a Rogowski coil outlined with a partly uncovered housing 3 displaying a bigger case 15 encasing the housing 3 with the toroidal coil 2 inside the housing 3. The multifunctional measuring device 1 is inserted into the bigger case 15 for providing a better mechanical protection of the multifunctional measuring device 1.

The windings of both the inner winding 2 and the external winding 4 are, for example, made of electrically conducting wires, which are externally insulated to enable using a semi-conductive or conductive cover for providing an electrical shielding for both the inner and the external windings 2, 4. The inner winding 2 can be wound around a plastic, semi-conductive or conductive but non-ferromagnetic core material.

The housing 3 can be made of insulating material such as plastic, or of semiconductive or conductive material.

The inner winding 2 and the external winding 4 are the two measuring elements of the measuring device. Each of those measuring elements can, for example, have the same and/or different parameters, ratings or accuracy design. The above construction can be suitable for Rogowski coil design technologies due to the external winding 4 and/or the internal winding 2 based on non-ferromagnetic core coil design. An exemplary advantage of this non-ferromagnetic core coil design is that the two measuring elements are not influenced by each other. The two measuring elements thus can be used for different purposes (e.g., one for a precision measurement of the current flowing through the primary current conductor within a relatively narrow range of values; and the other one for not so precise measurement within a wide range of values of the same current, such as a step change of said current).

Nevertheless, in some embodiments it can be useful to have an iron core for internal winding 2. In some applications the housing 3 can be earthed for screening of the inner winding 2.

If a desire arises for a better mechanical protection, the housing 3 with the external winding 4 and/or internal winding 2 can be inserted into at least one another bigger encasing case. If a desire arises for a better electrical shielding, said bigger cover can be made of a semi-conductive or conductive material or the housing 3 with the external winding 4 and/or internal winding 2 can be further inserted into a semi-conductive or conductive cover.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

The invention claimed is:

1. A multifunctional measuring device, comprising:
   a housing with an aperture for receiving a primary current conductor therethrough;
   an inner winding, accommodated around said aperture inside of said housing, the inner winding forming a first measuring element for measuring a current in the primary current conductor and the inner winding includes a return conductor for reducing effects of stray magnetic fields; and
   an external winding wound on said housing around said aperture, the external winding forming a second measuring element for providing an additional current measurement in the primary current conductor,
   wherein the first measuring element has different parameters, ratings, or accuracy than the second measuring element.

2. The multifunctional measuring device according to claim 1, wherein said housing has a toroidal shape.

3. The multifunctional measuring device according to claim 2, wherein said inner winding is wound as a toroidal shape coil.

4. The multifunctional measuring device according to claim 1, wherein said housing comprises:
   a lower part; and
   an upper part, said inner winding being contained between the lower part and the upper part of said housing.

5. The multifunctional measuring device according to claim 1, wherein said inner winding comprises:
   a plurality of series connected coils wound on small linear cores arranged in a shape of a polygon around the aperture, the axes of said coils being arranged in a plane perpendicular to an axis through which said primary current conductor will pass through the aperture and tangentially around the axis of said primary current conductor which will pass through the aperture.

6. The multifunctional measuring device according to claim 2, wherein at least one of said external winding and said internal winding is based on a non-ferromagnetic core coil design.

7. The multifunctional measuring device according to claim 1, wherein said housing is made of an electrically insulating material.

8. The multifunctional measuring device according to claim 7, wherein the housing is made of plastic material.

9. The multifunctional measuring device according to claim 1, wherein said housing is made of an electrically semiconductive or conductive material and both the lower part and the upper part of said housing are earthed for screening said inner winding.

10. The multifunctional measuring device according to claim 5, wherein the inner winding is mechanically fixed inside of the housing by a material filling a space between the inner winding (2) and an inside surface of the housing.

11. The multifunctional measuring device according to claim 1, wherein the inner winding is wound on a plastic, semi-conductive or conductive but non-ferromagnetic core material.

12. The multifunctional measuring device according to claim 1, comprising:
   at least one additional, larger case encasing the housing with the external winding and/or the internal winding.

13. The multifunctional measuring device according to claim 1, wherein the housing containing at least one of the external winding and the internal winding is inserted into an electrically semi-conductive or conductive cover for providing an electrical shielding.

14. The multifunctional measuring device according to claim 3, wherein at least one of said external winding and said internal winding is based on a non-ferromagnetic core coil design.

15. The multifunctional measuring device according to claim 1, in combination with a primary current conductor passed through said aperture.

16. The multifunctional measuring device according to claim 5, in combination with a primary current conductor passed through said aperture.

17. The multifunctional measuring device according to claim 3, in combination with a primary current conductor passed through said aperture.

* * * * *